United States Patent [19]
Ogino et al.

[11] Patent Number: 5,390,811
[45] Date of Patent: Feb. 21, 1995

[54] WAFER BASKET FOR CONTAINING SEMICONDUCTOR WAFERS

[75] Inventors: Nobuyoshi Ogino, Musashino; Toshitsugu Yajima, Itoigawa, both of Japan

[73] Assignees: Shin-Etsu Handotai Co., Ltd.; Shin-Etsu Polymer Co., Ltd., both of Tokyo, Japan

[21] Appl. No.: 205,770

[22] Filed: Mar. 4, 1994

Related U.S. Application Data

[63] Continuation of Ser. No. 937,219, Aug. 28, 1992, abandoned.

[30] Foreign Application Priority Data

Aug. 30, 1991 [JP] Japan .................. 3-245254

[51] Int. Cl.⁶ ............................................. B65D 45/16
[52] U.S. Cl. ................................. 220/326; 220/4.21; 220/378; 206/334; 206/445; 206/508; 206/509; 206/511
[58] Field of Search ............... 220/324, 326, 378, 262, 220/263, 264, 4.21, 4.23; 206/334, 445, 444, 508, 509, 511

[56] References Cited

U.S. PATENT DOCUMENTS

| | | | |
|---|---|---|---|
| 3,175,853 | 3/1965 | Gilbertson | 220/326 X |
| 4,450,960 | 5/1984 | Johnson | 206/334 |
| 4,520,925 | 6/1985 | Johnson | 206/334 |
| 4,817,799 | 4/1989 | Gregerson et al. | 206/445 |
| 4,901,882 | 2/1990 | Goncalves | 220/324 |
| 4,966,284 | 10/1990 | Gregerson et al. | 206/334 X |
| 5,100,015 | 3/1992 | Vanderstuyf | 220/326 |
| 5,135,126 | 8/1992 | Petit | 220/326 |

Primary Examiner—Allan N. Shoap
Assistant Examiner—Stephen Cronin
Attorney, Agent, or Firm—Whitham, Curtis, Whitham & McGinn

[57] ABSTRACT

A wafer basket which is provided with a new type of locking and unlocking device for locking the top lid to the main body of the outer box and unlocking the same, wherein it is possible to unlock it by merely pressing a part of the locking and unlocking device inwardly; furthermore, the top lid and the bottom of the main body are shaped such that they fit and engage with each other.

9 Claims, 9 Drawing Sheets

WAFER BASKET FOR CONTAINING SEMICONDUCTOR WAFERS

This application is a continuation of application Ser. No. 07/937,219, filed Aug. 28, 1992, now abandoned.

BACKGROUND OF THE INVENTION

The present invention relates to a wafer basket for containing a plurality of semiconductor wafers, and more particularly it relates to such a wafer basket equipped with an improved device for locking and unlocking the lid.

Semiconductor wafers to be made into substrates for semiconductor electronic devices are obtained by thinly slicing a single crystal ingot of a semiconductor material such as silicon in a direction substantially perpendicular to the axis of the ingot. Thus, a semiconductor wafer is thin and fragile; besides, it need be kept clean from any contamination. Hence, transportation of wafers requires a great care and caution.

For this reason, it was a conventionally adopted practice to place wafers in a row at regular intervals in a wafer basket and transport the wafers in the basket. FIGS. 10–12 show an example of such wafer basket (ref. Japanese Utility Model Application Kokai 63-166948).

A wafer basket is a box-like rack for containing semiconductor wafers, and is commonly molded integrally of a synthetic resin. FIG. 10 is a side view of the wafer basket, FIG. 11 is a front view of the wafer basket, and FIG. 12 is an enlarged cross section taken on line D—D of FIG. 11; this wafer basket consists of an outer box 101 and an inner box 102; a plurality of wafers W are each received in the respective grooves defined by and between partition ribs 102b which form the pleated side walls 102a, 102a of the inner box 102, which are facing each other; therefore, the wafers are placed in a row perpendicular to the sheet of FIG. 10 at regular intervals in the inner box 102. The wafer basket is also a vehicle means for transporting the wafers W it contains.

The outer box 101 consists of a main body 101A and a top lid 101B, and when an inner box 102 containing wafers W is inserted in the main body 101A of the outer box, a top lid 101B is fitted on the upper rim of the main body 101A to thereby close the wafer basket.

Now, the locking device which works when the top lid 101B is fitted over the main body 101A of the outer box 101 will be described. The top lid 101B is provided with a pair of resilient hooks 116, 116 one on the front side and the other on the rear side (only the front one is shown in FIG. 11) in a manner such that they oppose each other and extend from the lower periphery of the top lid 101B downward; the hooks 116 are horizontally elongated along the box side and near either end of each hook is made an engagement hole 116a.

Engagement pins 122 are formed to extend more or less horizontally from the upper rim portion of the main body 101A of the outer box 101 at locations which coincide with the engagement holes 116a of the hook 116. When the top lid 101B is fitted on the upper rim of the main body 101A of the outer box 101, as shown in FIG. 12, the engagement holes 116a made in the hooks 116 of the top lid 101B allow the corresponding engagement pins 122 of the main body 101A of the outer box 101 to enter them to thereby automatically engage with the corresponding engagement pins 122 with the result that the top lid 101B is locked to the main body 101A of the outer box 101.

Incidentally, in the above conventional locking device, to unlock and open the top lid 101B, it was necessary to disengage the engagement holes 116a from the engagement pins 122 by pulling the hooks 116 of the top lid 101B outwardly (in the direction indicated by the arrow in FIG. 12), as shown in two-dot chain line.

PROBLEMS THE INVENTION SEEKS TO SOLVE

However, when pulling the hooks 116 outwardly one had to first hitch the lower ends of the hooks 116 and apply a sufficient force outwardly, so that the operation efficiency was necessarily poor and if this operation is to be automatically conducted the mechanism for opening and closing the top lid 101B need be complicated.

The wafer baskets are commonly collected in groups and the baskets are often piled one on another, as show in FIG. 13. However, the baskets may slip and fall.

The present invention was contrived in view of the above problems, and it is, therefore, an object of the invention to provide a wafer basket for containing semiconductor wafers equipped with a device for locking and unlocking the lid of the wafer basket wherein it is possible to lock and unlock the lid to and from the main body of the outer box without pulling the hook outwardly, so that the operation efficiency in opening and closing the wafer basket is improved in manual operation, and in the case of an automatic operation the mechanism for opening and closing the top lid 101B becomes simple; it is also sought that the wafer baskets can be piled up safely.

MEANS TO SOLVE THE PROBLEMS

In order to attain the above objects of the invention, the present invention proposes a wafer basket which comprises:

an outer box consisting of a top lid and a main body, and a device for locking and unlocking the top lid to and from the main body of the outer box, and this wafer basket is improved in the device for locking and unlocking the top lid, which device comprises a plurality of hook means and as many hook holders, both made of a resilient material, wherein the vertical peripheral brim of the top lid is provided with either hook means or hook holders at least one on either opposing side of the top lid so that the hook means or hook holders oppose each other, the main body of the outer box is provided with a plurality of hook means, if the top lid is provided with the hook holders, or a pair of the hook holders, if the top lid is provided with the hook means, on either opposite side at locations which coincide with the hook means of the top lid when the lid is fitted on the main body, the hook means being adapted to automatically engage with the respective hook holders as the lid is fitted on the main body, and the hook means is adapted to be disengaged from the respective hook holder when the hook means is pushed inwardly.

In the wafer basket, according to another aspect of the invention, the top lid and the bottom of the main body of the outer box are shaped such that they fit and engage with each other.

EFFECTS OF THE INVENTION

According to the invention, one can unlock the top lid from the outer box main body by merely pushing the hook means of the top lid inwardly. To push the hook inwardly is much easier in applying the force than to pull the hook means outwardly, so that the operation efficiency in opening the top lid becomes much improved, and automatization of this operation becomes much simpler, because an additional device required is one that merely pushes the hook means of the top lid inwardly.

Also, according to the invention, since the top surfaces and the bottom surfaces of the wafer basket are complementary in shape, they fit each other and would not slip and fall when the wafer baskets are piled up.

BRIEF DESCRIPTION OF THE INVENTION

The present invention will become more fully understood from the description given hereinbelow and the accompanying drawings which are given by way of illustration only, and thus are not limitative of the present invention and wherein.

Further scope of applicability of the present invention will become apparent from the detailed description given hereinafter. However, it should be understood that the detailed description and specific examples, while indicating preferred embodiments of the invention are given by way of illustration only, since various changes and modifications within the spirit and scope of the invention will become apparent to those skilled in the art from this detailed description.

EMBODIMENTS

Now, with reference to the attached drawings, a first embodiment of the invention will be described.

Figure 1:
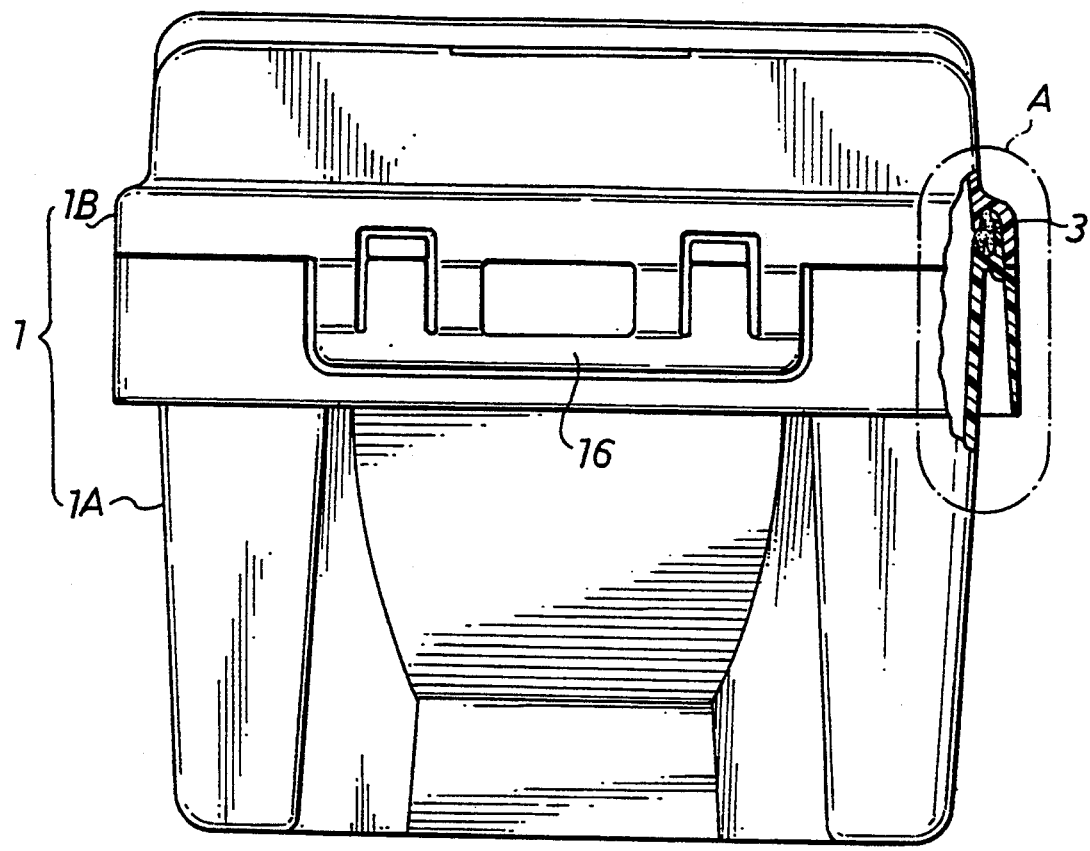
FIG. 1 is a partially broken front view of a wafer basket equipped with a lock/unlock device according to a first embodiment of the present invention.
Figure 2:
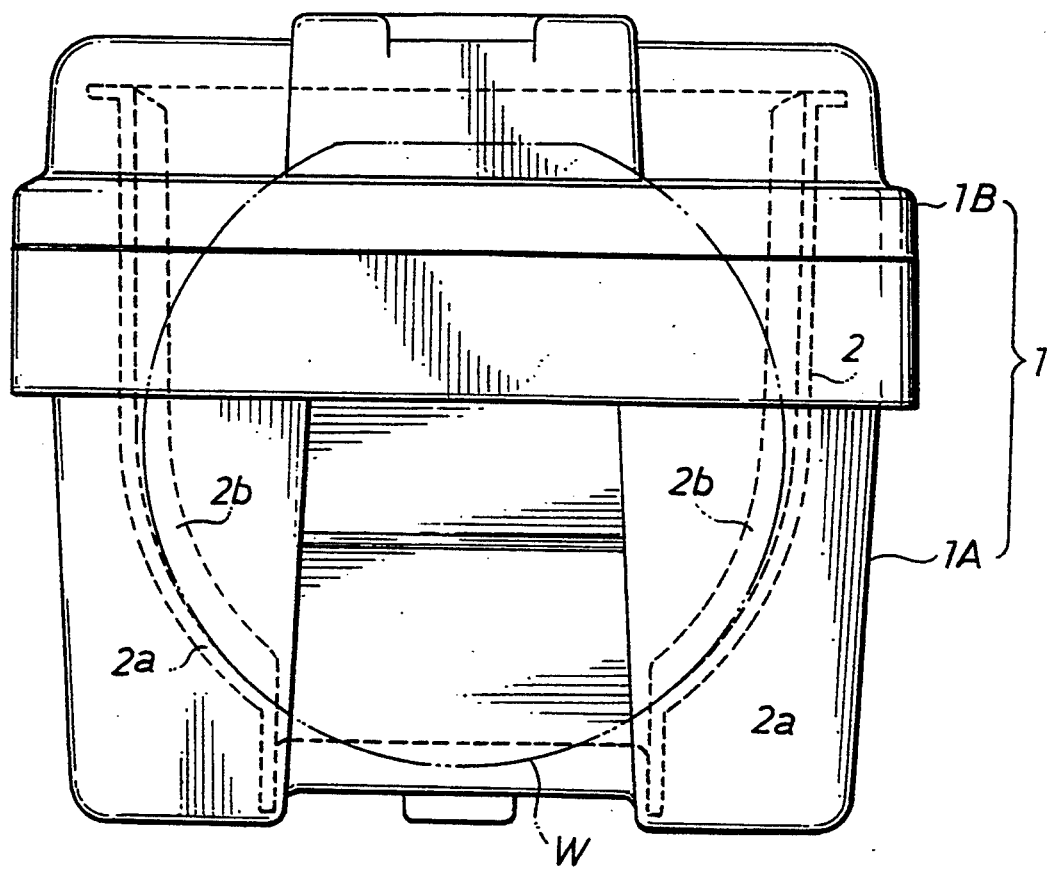
FIG. 2 is a side view of the wafer basket equipped with the lock/unlock device according to the first embodiment of the present invention.
Figure 3:
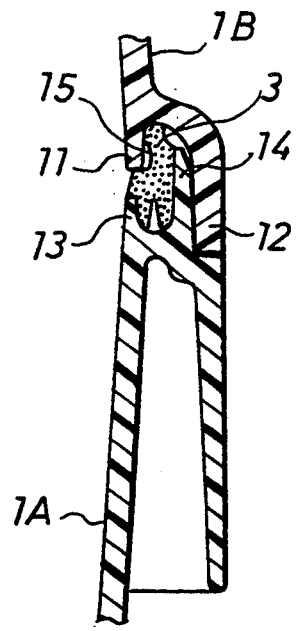
FIG. 3 is an enlarged view of the portion A of FIG. 1.
Figure 4:
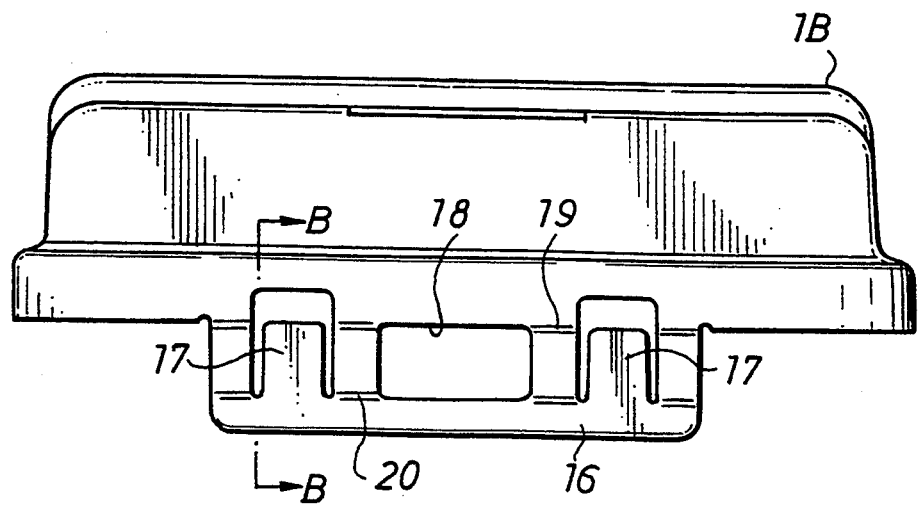
FIG. 4 is a front view of the top lid.
Figure 5:
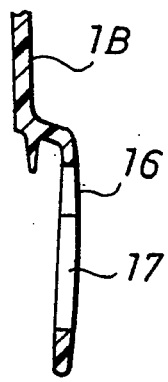
FIG. 5 is a cross section taken on line B—B of FIG. 4.
Figure 6:
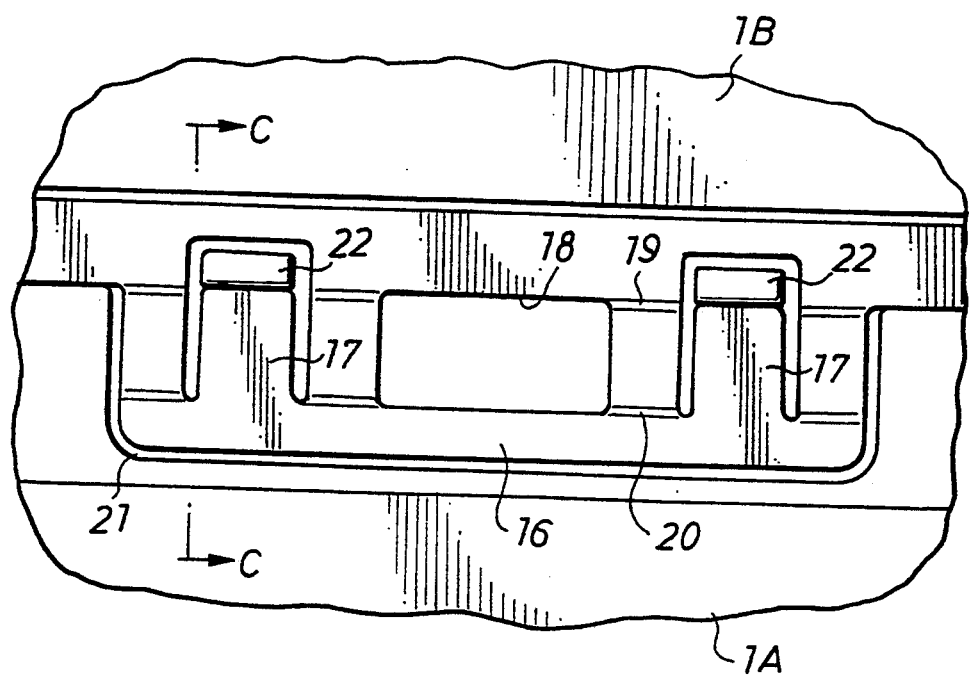
FIG. 6 is front view of a hook showing the construction of the lock/unlock device according to the first embodiment of the present invention.
Figure 7:
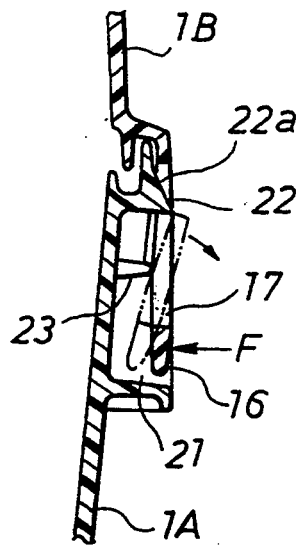
FIG. 7 is a cross section taken on line C—C of FIG. 6.
Figure 8:
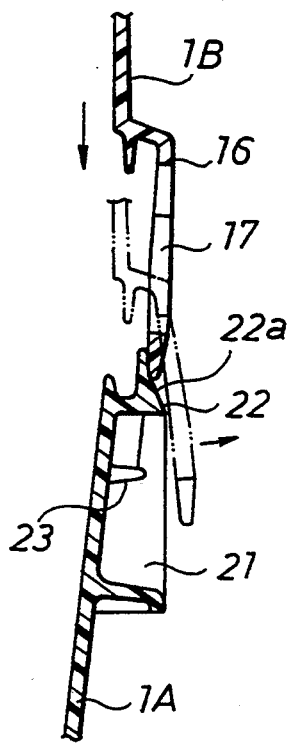
FIG. 8 is a view similar to FIG. 7 showing how the hook operates when the top lid closes the basket.

FIG. 1 is a partially broken front view of a wafer basket equipped with a lock/unlock device of the present invention; FIG. 2 is a side view of the same wafer basket; FIG. 3 is an enlarged view of the portion A of FIG. 1; FIG. 4 is a front view of the top lid; FIG. 5 is a cross section taken on line B—B of FIG. 4; FIG. 6 is front view of the hook showing the construction of the lock/unlock device of the present invention; FIG. 7 is a cross section taken on line C—C of FIG. 6; and FIG. 8 is a view similar to FIG. 7 showing how the hook operates when the top lid closes the wafer basket.

The wafer basket of the present invention comprises an outer box 1 and an inner box 2 inserted in said outer box 1, as shown in FIG. 1 and FIG. 2.

The outer box 1 consists mainly of a main body 1A and a top lid 1B, and the top lid 1B is adapted to fit on the upper rim of the main body 1A of the outer box 1 whereby the top lid 1B is locked to the main body 1A of the outer box 1. When the main body 1A is thus covered with the top lid 1B, the outer box 1 is hermetically closed by virtue of a seal ring 3.

The inner box 2 is for holding a plurality of wafers in a row at regular intervals; it opens upward as well as in the bottom, the bottom opening being narrower than the upper opening, because a pair of facing side walls 2a, 2a are curved inwardly at the bottom in a manner such that a wafer-sized circle may be roughly inscribed to the inner surface of the curved side walls. The side walls 2a, 2a are pleated to form ribs 2b which extend vertically and are arranged in a horizontal row at regular intervals, the intervals forming grooves for receiving wafers.

The side walls 2a, 2a are in mirror symmetry so that each pair of facing grooves form a seat suitable to receive a wafer vertically. Thus, the wafers are fitted into respective pairs of facing grooves of the side walls 2a, 2a.

Extending integrally from the lower periphery of the top lid 1B are an inner wall 11 and an outer wall 12, which constitute a double-layer wall, as shown in detail in FIG. 3. Also, extending integrally from the upper rim of the main body 1A of the outer box 1 are an inner wall 13 and an outer wall 14, which constitute a double-layer wall, as shown in detail in FIG. 3.

When the top lid 1B is fitted on the upper rim of the main body 1A of the outer box 1, the outer wall 12 of the top lid 1B becomes engaged with the outer wall 14 of the main body 1A of the outer box 1, as shown in FIG. 3. With the things as they are, there is defined a space 15 by the outer walls 12 and 14, and the respective inner walls 11, 13 of the top lid 1B and the main body 1A of the outer box 1, and a seal ring 3 is laid in this space 15; by virtue of the sealing performance of this seal ring 3, the external air is prevented from entering the outer box 1 through the joint between the top lid 1B and the main body 1A of the outer box 1.

Now, the lock/unlock device for the top lid 1B according to the present invention will be described with reference to FIGS. 4 through 8.

The top lid 1B is provided with a pair of hooks 16, 16 one on the front side and the other on the back side (only the front one is shown in FIG. 4) in a manner such that they oppose each other and extend integrally from the lower periphery of the top lid 1B downward (or forward, since in this direction the top lid is moved when closing); the hooks 16 are horizontally elongated along the box side and near either end of each hook 16 is formed an engagement tongue 17, and in the middle of the hook 16 is made a rectangular engagement hole 18. Each engagement tongue 17 extends vertically backward from the fore end portion of the hook 16, and has a horizontal free end at the tail end. Also, horizontal grooves 19, 20 having a semicircular cross section and extending along the box side are formed in the outer face of the hook 16 so that the hook 16 can bend outwardly at the horizontal grooves 19, 20. Incidentally, in the case of a large-sized wafer basket, it is possible to provide the top lid 1B with more than one pair of hooks 16, 16, e.g., two hooks each on the front side and on the rear side of the top lid 1B.

As shown in FIGS. 6 through 8, on either side of the main body 1A of the outer box 1 is formed a rectangular recess 21 for engaging with the hook 16, at locations which coincide with the hooks 16. Either side, front and back, of the upper rim of the main body 1A of the outer box 1 is provided with a pair of click bosses 22, 22 for engaging with the top edges of the engagement tongues 17, 17 of the respective hook 16. Incidentally, each click boss 22 is formed with a generally horizontal bottom face at the tail end and a front face 22a, which is sloped such that the front face forms an angle of about 80° with the bottom face.

Similarly, on either side of the main body 1A of the outer box 1 are formed a pair of fulcrum bosses 23, 23 to extend generally horizontally outward, only one of which is shown in FIG. 7, at locations below the respective click bosses 22, 22 such that when the top lid 1B is fitted and locked on the main body 1A of the outer box 1, the fulcrum bosses 23, 23 contact the middle of the back face of the respective engagement tongues 17.

Thus, in order to close the main body 1A of the outer box 1 with the top lid 1B, the top lid 1B is placed on the upper rim of the main body 1A of the outer box 1, as shown in FIG. 8, and then forced down for locking. As the top lid 1B is thus lowered from the position drawn in solid line to the position drawn in two-dot chain line in FIG. 8, the lower end of each hook 16 of the top lid 1B contacts and slides on the sloped front face 22a of respective click boss 22 whereby the hook 16 is slightly bent outwardly, and after the lower end of each hook 16 goes beyond the slope 22a, the back face of the hook 16, in particular that of the engagement tongue 17, slides on the corner of the click boss 22 at which the sloped front face and the horizontal face merge together whereby the hook 16 is further bent outwardly; the moment the upper free end (tail end) of the engagement tongue 17 passes said corner of the click boss 22, the free end flips around the corner to engage with the horizontal face of the click boss 22 and the hook 16 turns back to its original vertical posture by virtue of its resilience, whereupon the engagement tongue 17 engages with the click boss 22 (ref. FIG. 7) with the result that the top lid 1B is locked to the main body 1A of the outer box 1, and the backward movement of the top lid 1B is now checked.

Next, in order to unlock the top lid 1B from the main body 1A of the outer box 1, one needs only to press the lower end of each hook 16 of the top lid 1B inwardly with a sufficient force F, as shown in FIG. 7. Then, each engagement tongue 17 of the hooks 16 is tilted in a manner such that the upper half of the engagement tongue 17 turns outward and the lower half inward, as shown in FIG. 7, about the tip of the respective fulcrum boss 23 extending from the main body 1A of the outer box 1, and takes a slanted posture as drawn in two-dot chain line in FIg. 7, i.e., the free end of the engagement tongue 17 has passed beyond said corner of the click boss and the engagement of each engagement tongue 17 with each click boss 22 is undone. Thereafter, the top lid 1B is lifted higher to be removed away from the main body 1A of the outer box 1.

To push the hooks 16 inwardly with the sufficient force F is much easier and simpler than the conventional manner of pulling the hooks outwardly with the same force F because there is no need of finding and hitching at an edge of the hooks 16; thus the Operation of opening the top lid 1B can now be conducted with higher efficiency.

Also, in planning on automatizing the operation of opening and closing the top lid 1B, the design for the mechanism for opening and closing the top lid 101B can be simpler than in the case of conventional apparatuses, since the device of the present invention requires a mechanism which merely pushes the hooks 16 of the top lid 1B inwardly.

Next, a second embodiment of the present invention will be described with reference to FIG. 9. In relation to the first embodiment, like elements are designated by like reference numerals for easy reference.

Figure 9:
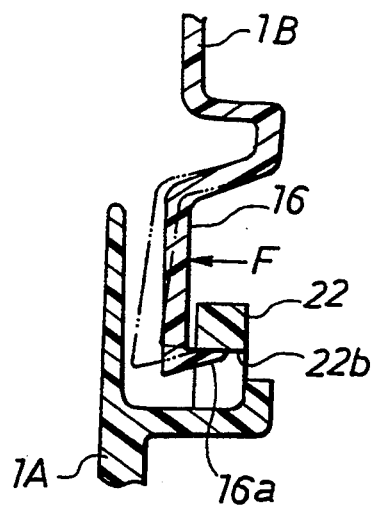
FIG. 9 is a cross section showing the construction of the lock/unlock device according to a second embodiment of the present invention.
Figure 10:
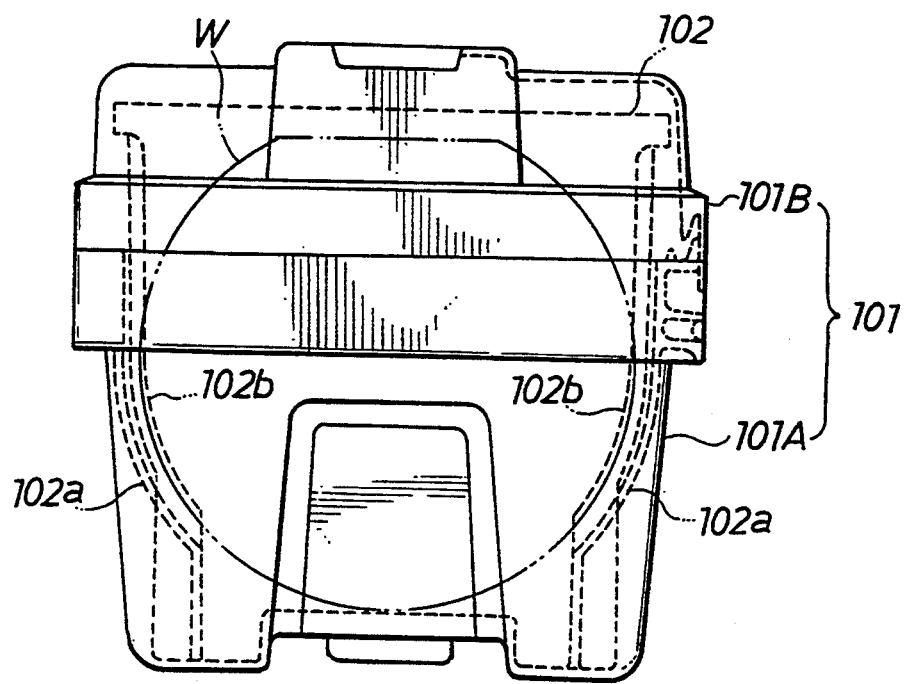
FIG. 10 is a side view of a wafer basket having a conventional lock/unlock device.
Figure 11:
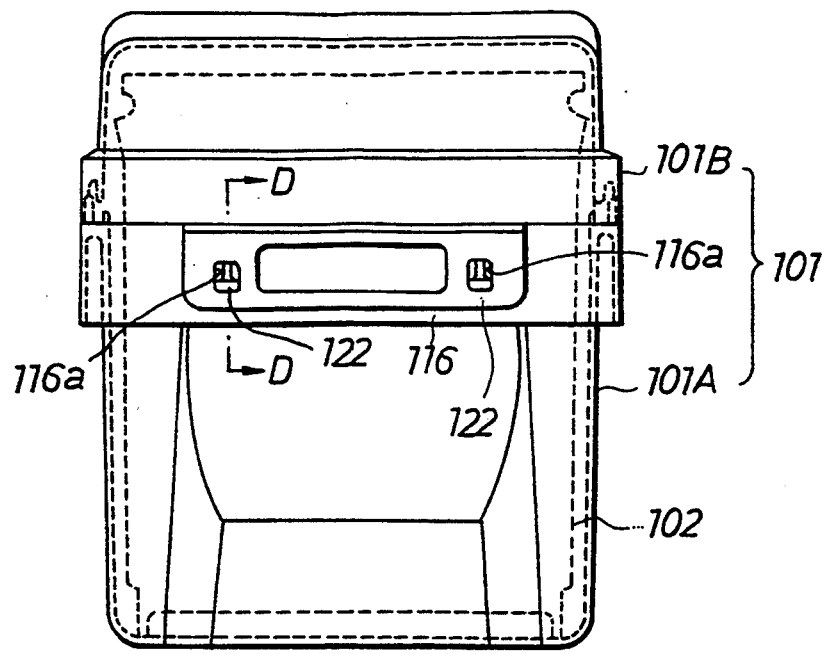
FIG. 11 is a front view of the wafer basket having the conventional lock/unlock device.
Figure 12:
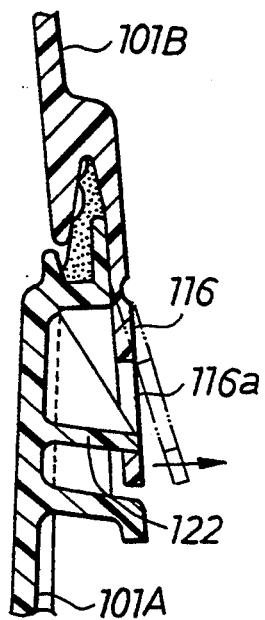
FIG. 12 is an enlarged cross section taken on line D—D of FIG. 11.

FIG. 9 is a longitudinal cross section (similar as FIG. 7) of a lock/unlock device of the second embodiment, in which each hook 16 of the top lid 1B is crooked for more responsive resilient movement and formed with an engagement nail 16a at the lower end thereof. The nail 16a points horizontally and outwardly and has a horizontal upper (tail) face. The upper rim of the main body 1A of the outer box 1 is provided with click bosses 22 each having a horizontal face at its lower (tail) end which defines the fore end of a groove 22b. When the top lid 1B is fitted on the main body 1A of the outer box 1, the nail 16a of each hook 16 is engaged with the respective groove 22b of the click boss 22 of the main body 1A of the outer box 1 in a manner such that the nail 16a enters the groove 22b from inside, and by virtue of this engagement the top lid 1B is locked to the main body 1A of the outer box 1.

In order to unlock the top lid 1B from the main body 1A of the outer box 1, one needs only to press each hook 16 of the top lid 1B inwardly with a sufficient force F; then, each resilient hook 16 is bent inwardly, as shown in two-dot chain line in FIG. 9, whereupon the engagement of each nail 16a with each click boss 22 is undone. Thereafter, the top lid 1B is lifted higher to be removed away from the main body 1A of the outer box 1. Therefore, this second embodiment as well as the first embodiment provides the results which attain the objects of the invention.

Figure 13:
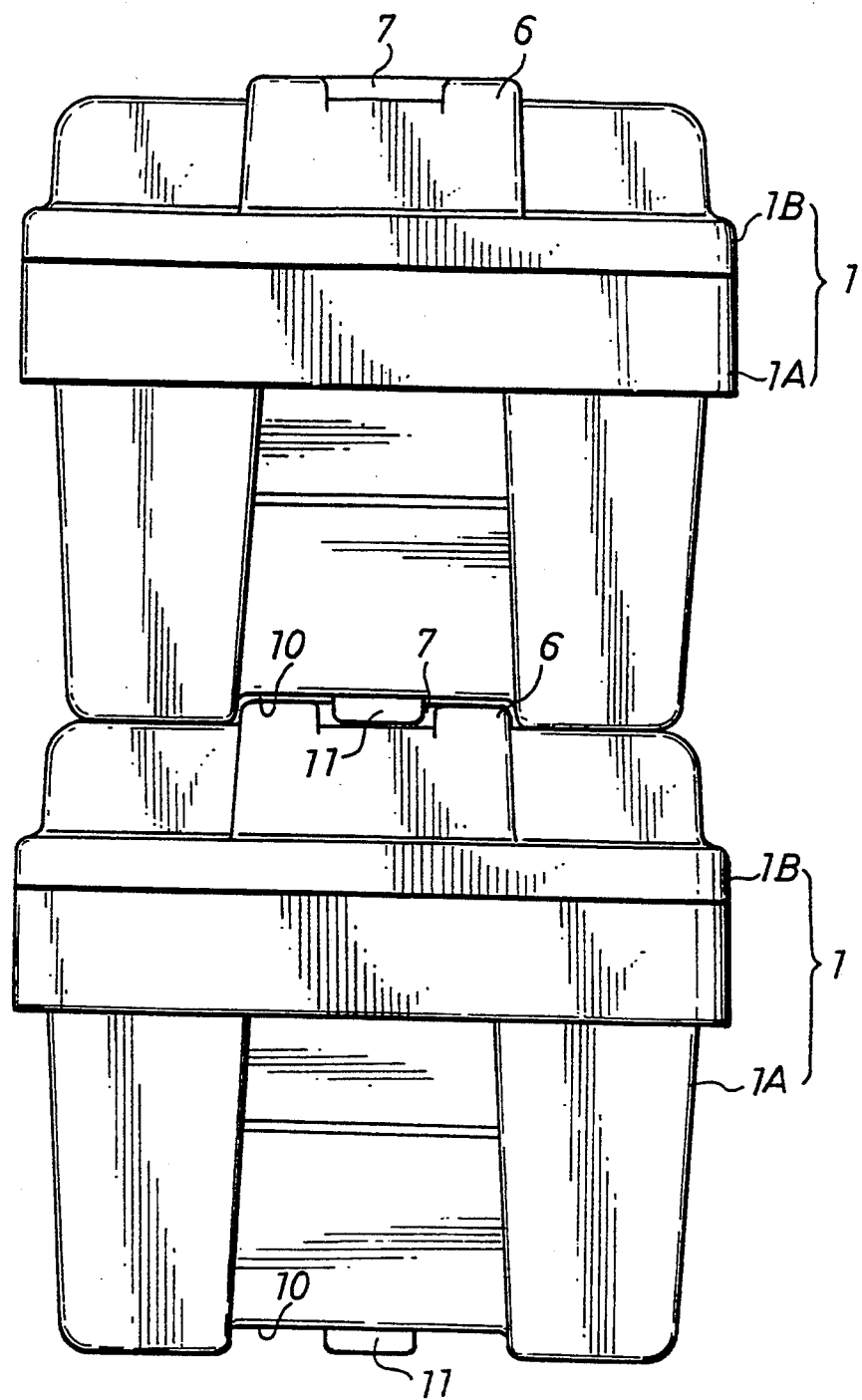
FIG. 13 is a side view of wafer baskets of the present invention showing how they are piled up.
Figure 14:
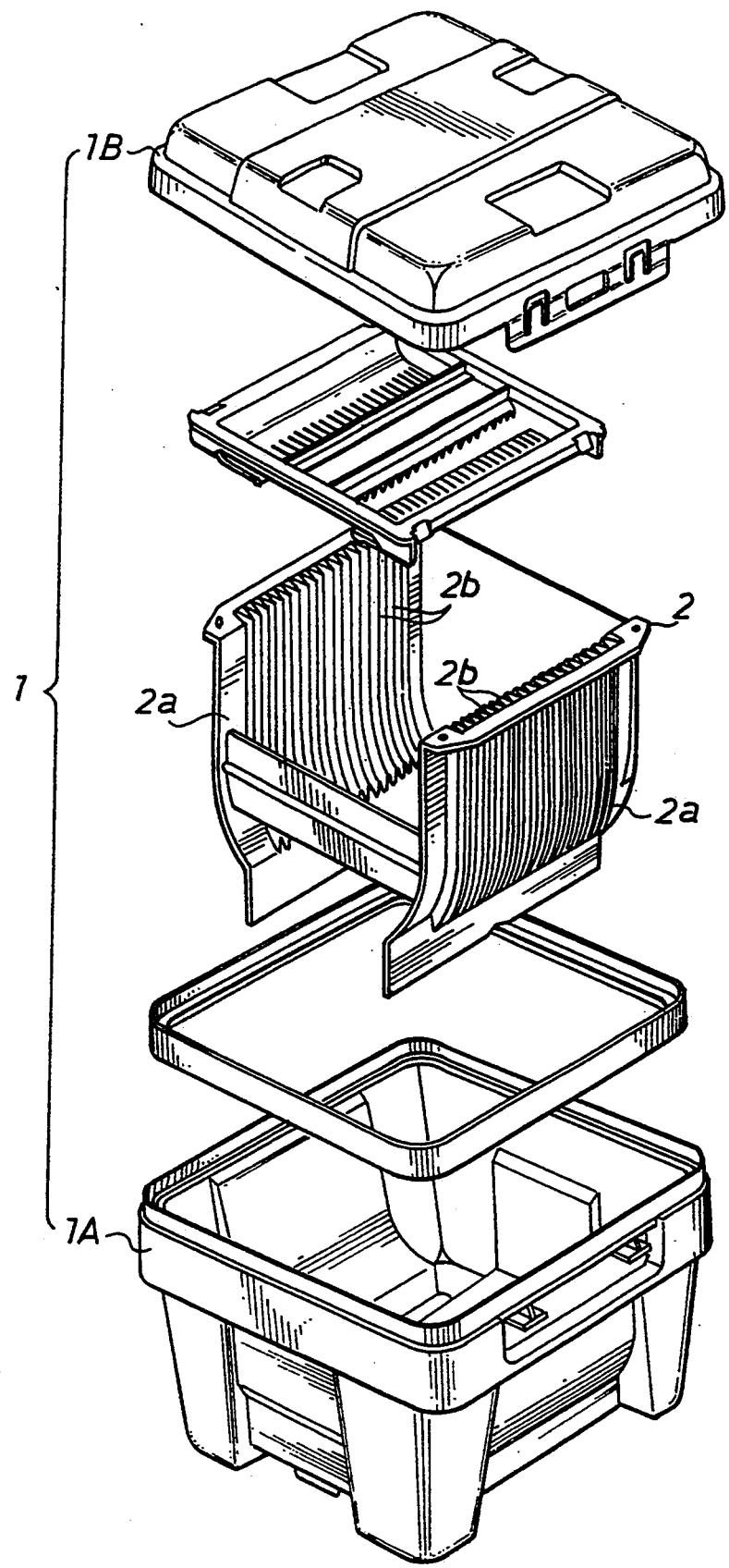
FIG. 14 is an exploded perspective view of a wafer basket of the present invention showing the interior as well as the external configuration of the basket.

Incidentally, FIGS. 13 and 14 show a different aspect of the invention wherein the top lids and the bottoms of the wafer baskets are shaped such that they fit and engage with each other. This way the basket piled on top of another will not slip and fall.

RESULTS OF THE INVENTION

As is clear from the above description, according to the present invention, it is now possible to lock and unlock the lid to and from the main body of the outer box without pulling the hook outwardly, so that the operation efficiency in opening and closing the wafer basket is improved in manual operation, and in the case of an automatic operation the mechanism for opening and closing the top lid 101B becomes simple.

What is claimed is:

1. A container for semiconductor wafers comprising an outer box having a main body with sides and a lid having a peripheral brim surrounding a portion of said sides of said main body when said lid is placed on said main body, said lid being further adapted to fit on an edge of said sides of said main body, at least one side of at least one of said main body and said lid having a click boss integrally formed therewith, a corresponding side of the other of said main body and said lid having a hook means integrally formed therewith for engaging said click boss, at least one of said click boss and said hook means including means for causing engagement of said hook means and said click boss when said lid is fitted on sid main body, and a means located at a periphery of said container for disengaging said hook means from said click boss when an inward force is applied to said hook means, said means for disengaging said hook means from said click boss including fulcrum boss member, integrally formed with at least one of said main body and said lid at a location adjacent said hook means, for causing outward motion of a portion of said hook means in response to said inward force.

2. A container as recited in claim 1, wherein said hook means includes a resilient engagement tongue for engaging said click boss.

3. A container as recited in claim 2, wherein said fulcrum boss is located to engage said hook means at the approximate mid-point of said resilient tongue.

4. A container as recited in claim 1, wherein said fulcrum boss is integrally formed with said at least one of said main body and said lid at a location spaced from said click boss.

5. A container as recited in claim 1, wherein said click boss has a face for engagement by said hook means and said means for causing engagement includes a sloped surface of said click boss forming an angle with said face for engagement by said hook means.

6. A container as recited in claim 5, wherein said angle is approximately 80°.

7. A container as recited in claim 1, wherein a pair of said hook means are provided on at least one side of said peripheral brim of said lid and a pair of click bosses are provided on a corresponding side of said main body for engagement by respective ones of said hook means.

8. A container as recited in claim 1 wherein a bottom of said main body and a top of said lid are shaped to fit with and engage each other.

9. A container for semiconductor wafers comprising an outer box having a main body with sides and a lid having a peripheral brim surrounding a portion of said sides of said main body when said lid is placed on said main body, said lid being further adapted to fit on an edge of said sides of said main body, at least one side of at least one of said main body and said lid having a click boss integrally formed therewith, a corresponding side of the other of said main body and said lid having a hook means integrally formed therewith for engaging said click boss, at least one of said click boss and said hook means including means for causing engagement of said hook means and said click boss when said lid is fitted on said main body, and a means located at a periphery of said container for disengaging said hook means from said click boss when an inward force is applied to said hook means, said means for disengaging said hook means from said click boss including a fulcrum boss integrally formed with at least one of said main body and said lid at a location adjacent said hook means whereby a portion of said hook means is forced outwardly by said inward force, wherein said hook means includes a resilient engagement tongue for engaging said click boss, and wherein said fulcrum boss is located to engage said hook means at the approximate mid-point of said resilient tongue.

* * * * *